United States Patent [19]

Nair et al.

[11] 4,386,116
[45] May 31, 1983

[54] PROCESS FOR MAKING MULTILAYER INTEGRATED CIRCUIT SUBSTRATE

[75] Inventors: Krishna K. Nair, Binghamton; Keith A. Snyder, Vestal, both of N.Y.

[73] Assignee: International Business Machines Corporation, Armonk, N.Y.

[21] Appl. No.: 334,297

[22] Filed: Dec. 24, 1981

[51] Int. Cl.³ ............................................. B05D 5/12
[52] U.S. Cl. .................................... 427/99; 427/250; 427/255; 427/255.7; 427/318; 427/88; 427/89; 427/91; 357/71; 204/192 C
[58] Field of Search ............. 427/99, 250, 255, 255.7, 427/318, 88, 89, 91; 357/71; 204/192 C

[56] References Cited

U.S. PATENT DOCUMENTS 3,204,158  8/1965  Schreiner et al. ................... 357/71
3,881,884  5/1975  Cook et al. ......................... 357/71
4,046,660  9/1977  Fraser .............................. 204/192 C

OTHER PUBLICATIONS

J. Gow III et al., Process for Making Multilayer IC Substrate, IBM TDB, vol. 22, No. 4, Sep. 1979, pp. 1420-1421.
Abolafia, Method of Connecting Layers of Circuitry Separated by a Dielectric, IBM TDB, vol. 22, No. 10, Mar. 1980, pp. 4471-4473.

Primary Examiner—Won H. Louie, Jr.
Attorney, Agent, or Firm—Gerald R. Gugger

[57] ABSTRACT

A process is provided for making a multilayer integrated circuit substrate having improved via connection. A first layer M1 of chrome-copper-chrome is applied to a ceramic substrate and the circuits etched. A polyimide layer is then applied, cured, and developed and etched to provide via holes in the polyimide down to the M1 circuitry. The top chrome is now etched to expose the M1 copper in the via holes. A second layer M2 of copper-chrome is evaporated onto the polyimide at a high substrate temperature to provide a copper interface at the base of the vias having no visable grain boundaries and a low resistance. M2 circuitization is then carried out.

4 Claims, 2 Drawing Figures

PRIOR ART

PROCESS FOR MAKING MULTILAYER INTEGRATED CIRCUIT SUBSTRATE

BACKGROUND OF THE INVENTION

In the making of a multilayer integrated circuit substrate, there has evolved a, so called, MCP or metallized ceramic polyimide structure. This structure comprises a ceramic substrate on which is evaporated a first layer M1 of chrome-copper-chrome on which printed circuitry is formed on the copper, a layer of polyimide, and a second evaporated layer M2 of chrome-copper-chrome on which printed circuitry is formed on the copper. Via holes are formed in the polyimide, prior to the deposition of the M2 layer, which extend down to the copper circuitry of the M1 layer and which conductively connect the circuitry on the M1 and M2 layers.

The above basic structure has presented problems in that there is no solubility of copper in chrome and, as a result, in the vias the bond between the copper of the M1 layer and the chrome of the M2 layer is a mechanical bond or coupling. Also, the top chrome of layer M1 is removed chemically at the bottom of the vias leaving copper which is exposed to air prior to the deposition of the M2 layer which results in oxidation. As such, this bonding system which depends entirely on a mechanical coupling and is extremely sensitive to film oxidation and/or contaminants at the metal to metal interface did not provide the desired adhesion and also created undue electrical resistance in the vias.

Subsequently, it was proposed to modify the above process to improve the interconnection between the M1 and M2 layers by etching the top chrome layer of M1 and the bottom chrome layer of M2 and providing a solder connection between the copper layer of M1 and the copper layer of M2. This modification is described in the IBM Technical Disclosure Bulletin, Vol. 22, No. 10, March 1980, pages 4471-4473. The modified process proved to have several disadvantages. It was an expensive process. The use of a solder connection limited the other processes to be carried out on the substrate due to the low melting point of the solder. Also, trouble was encountered due to entrapped solder fluxes in the vias. In the processing of large quantities of substrates, a process was still required which was less time consuming and less costly and which was more reliable and would still provide the desired adhesion and low via resistance.

SUMMARY OF THE INVENTION

The present invention overcomes the shortcomings of the aforementioned prior art and provides the desired adhesion between the M1 and M2 layers and the desired via resistance. This is accomplished by eliminating the first or bottom chrome layer of the M2 evaporation and using a substrate temperature of 360°-380° C. during the evaporation of the M2 layer of chrome-copper. This resulted in a copper-copper bond in the via that provided a low via resistance and good stability under stress testing. Metallurgical analysis shows that the copper grains of the M2 layer have bonded to the copper grains of the M1 layer such that no grain boundary could be observed between M1 and M2. The via resistance data for such processed MCP substrates was found to be extremely stable after temperature and humidity tests.

Accordingly, a primary object of the present invention is to provide a novel and improved process for providing via connections in a multilayer integrated circuit substrate.

A further object of the present invention is to provide a more feasible and economical process for making via connections in a multilayer integrated circuit substrate.

A still further object of the present invention is to provide a multilayer integrated circuit substrate having a first layer of chrom-copper-chrome, a layer of polyimide, a second layer of chrome-copper, and via connections having the copper of said first layer bonded directly to the copper of said second layer.

Another object of the present invention is to provide a process for making via connections in a multilayer integrated circuit substrate wherein copper is deposited onto a previously deposited copper film at high substrate temperature to form an interface without visable grain boundaries and which is utilized to make an electrical contact of low resistance.

The foregoing and other objects, features and advantages of the invention will be apparent from the following more particular description of a preferred embodiment of the invention, as illustrated in the accompanying drawings.

DESCRIPTION OF PREFERRED EMBODIMENT

Figure 1:
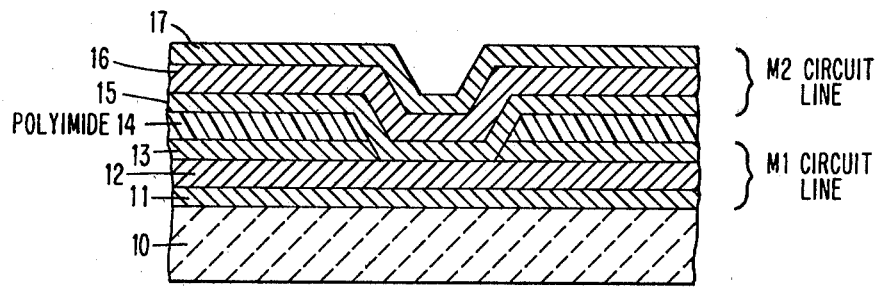
FIG. 1 illustrates in cross section a prior art conductive via connection in a miltilayer integrated circuit substrate.

Referring to FIG. 1, there is illustrated the previously mentioned prior art multilayer integrated circuit substrate which comprises a ceramic substrate 10 on which is evaporated the first circuit line layer M1 of chrome 11, copper 12, and chrome 13 on which printed circuitry is formed on the copper. A layer of polyimide 14 is deposited over the M1 layer of chrome 13 and on the polyimide is evaporated a second circuit line layer M2 of chrome 15, copper 16, and chrome 17 on which printed circuitry is formed on the copper. Via holes are formed in the polyimide, prior to the deposition of the M2 layer, which extend down to the copper circuitry of the M1 layer and which conductively connect the circuitry of the M1 and M2 copper layers.

The via connection between the printed circuitry of M1 and M2 is made through the M2 chrome layer 15 so that the electrical path in the via follows Cu-Cr-Cu metallurgy. However, the Cu-Cr-Cu via metallurgy is known to produce vias of unacceptable resistance stability thus causing a reliability problem. The via resistance problem has been analyzed to be due to (a) the inability of the M2 chrome to form a metallurgical bond to M1 copper, and (b) presence of an oxide layer on the M1 copper due to spontaneous oxidation and/or the presence of other contaminants on the M1 copper which are not suitably absorbed in the chromium layer of M2.

Figure 2:
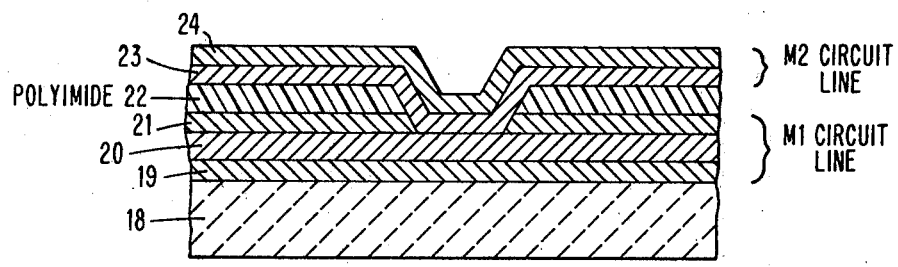
FIG. 2 illustrates in cross section a conductive via connection in a multilayer integrated circuit substrate and prepared by the method of the present invention.

Referring now to FIG. 2, there is illustrated the present improved via hole arrangement in a multilayer integrated circuit substrate. The circuit substrate is similar to the above-described prior art except that the bottom chrome layer of M2 has been eliminated. As shown, a ceramic substrate 18 has evaporated thereon a first circuit line layer M1 of chrome 19, copper 20, and chrome 21 on which printed circuitry is formed on the copper.

A layer of polyimide 22 is deposited over the M1 layer of chrome 21 and on the polyimide is evaporated a second circuit line layer M2 of copper 23 and chrome 24 on which printed circuitry is formed on the copper. Via holes are formed in the polyimide, prior to the deposition of the M2 layer, which extend down to the copper circuitry of the M1 layer and which conductively connect the circuitry of the M1 and M2 copper layers. In this case, the electrical path in the via follows Cu-Cu metallurgy.

Based on a series of experiments, it was found that by eliminating the first or bottom chrome layer of the M2 evaporation and using a 360°–380° C. substrate temperature, a Cu-Cu bond is obtained in the via that leads to low via resistance and good stability under stress testing. Metallurgical analysis shows that the Cu grains of M2 have bonded to the Cu grains of M1 such that no grain boundary could be observed between M1 and M2. This indicated that there was an absence of contamination which would weaken the bond. The via resistance data for such processed MCP substrates is found to be extremely stable after temperature and humidity tests.

It was found that the substrate temperature during evaporation of M2 is extremely critical in this respect and 360°–380° C. was required to produce such Cu-Cu interface vias. Although higher temperatures may enhance this process, 360°–380° C. was found to be the optimum for polyimide stability and from other practical considerations. The above technique may be extendable for other deposition processes such as sputtering.

The present via hole arrangement and multilayer integrated circuit substrate, shown in FIG. 2, is processed in the following manner:

(1) The M1 layer of chrome-copper-chrome is evaporated on the raw ceramic substrate at a substrate temperature of 280° C. by commercially available equipment wherein a pool of copper is contained and an electron beam is used to fire and melt the copper causing it to evaporate upward onto the substrate. The chrome in solid form is turned into a vapor by a resistance boat and evaporated upward onto the substrate. The bottom chrome layer 19 is given a thickness of 800 angstroms deposited at the rate of 6–8 angstroms per second. The copper layer 20 is given a thickness of 43000 angstroms deposited at the rate of 150 angstroms per second. The top chrome layer 21 is given a thickness of 800 angstroms deposited at the rate of 8–10 angstroms per second.

(2) Dot adhesion test made by attaching rivet onto copper using solder and measuring pull value using Instron. Typical values obtained were 3000–7000 p.s.i.

(3) Thickness measurement test, manufacturing inspection, and precleaning are carried out.

(4) Circuitization is now carried out through the use of conventional photolithography and circuits are etched on M1 metallurgy.

(5) Following circuitization, the polyimide layer 22 is applied to the surface by spraying and is partially cured ("A" cure) at 90° C. to remove excess solvent.

(6) A photoresist is applied, exposed and developed so that the via sites are exposed.

(7) Etching of the polyimide is carried out in KOH solution for a brief cycle of around 40 seconds.

(8) The polyimide is given a "B" cure at 210° C. to stabilize the material.

(9) The polyimide is again etched in KOH solution for a longer cycle of around 3 minutes and the photoresist is stripped. A via at this point in time is a hole in the polyimide down to the M1 circuitry.

(10) The polyimide now goes through the final cure cycle ("C" cure) at 360° C. in a nitrogen flow furnace. At this point, the polyimide can no longer be etched.

(11) During the "C" cure cycle, the exposed metal in the vias is oxidized. This oxide is removed by a series of cleaning steps.

(12) The top chrome 21 of the M1 layer is etched to expose the copper 20 at the base of the via holes.

(13) A bright-dip operation is carried out to remove oxidation of copper in the vias by immersion in 10% sulphuric acid for 1 minute, ultrasonic agitation, rinse in DI water, and alcohol dry.

(14) The M2 layer of copper-chrome is evaporated in the same manner as M1 was except that a substrate temperature of 360°–380° C. is used. The copper layer 23 is given a thickness of 80000 angstroms deposited at the rate of 150 angstroms per second. The chrome layer 24 is given a thickness of 800 angstroms deposited at the rate of 8 angstroms per second. The total cycle time is approximately 2 hours.

(15) Dot adhesion test made by attaching rivets with epoxy to blanket metal and pulled in Instron. Typical p.s.i. values obtained were 2000–4000 p.s.i. Minimum specification required is 1100 p.s.i.

(16) Measurement test and subsequent cleaning.

(17) Circuitization is now carried out through the use of conventional photolithography and circuits are etched on the M2 metallurgy.

(18) The substrate is now ready for subsequent conventional pinning and tinning processing and electrical testing of M2 for shorts/opens and resistance. Via resistance is measured on sample vias on a substrate by the four-point probe method.

Heretofore, it was not believed that copper would adequately adhere to polyimide. It was found that the adhesion was adequate. It is believed that the chemical reaction between the copper and the nitrogen in the polyimide provides the necessary adhesion. The present process is unique in that copper is evaporated on fully cured polyimide.

An unexpected result that was observed in the present process is that the presence of an oxide layer on the M1 copper does not increase the via resistance. Whereas oxidation to orange-red levels (200–300 angstroms) caused severely high via resistance (10 milliohms) in the case of Cu-Cr-Cu metallurgy, oxidation even to blue-grey level (several thousands of angstroms) does not cause any increase in via resistance (less than 1 milliohm) in the case of Cu-Cu metallurgy. The reason for this is not fully understood. It is believed that the temperature range used in the process is such that the copper oxide becomes either soluble in the copper or it is broken up into particles which allows the copper of M1 to contact the copper of M2.

Another interesting observation is that the Cu-Cu metallurgy is unaffected by the presence of certain organic residues at the interface whereas Cu-Cr-Cu metallurgy shows catastrophically high via resistance under similar conditions. It is believed that the film of organic residue is penetrated by the copper evaporation. Thus, the Cu-Cu metallurgy is able to give reliable vias even when processed in the presence of contaminants.

The present process results in a number of advantages:

(1) It offers a process to make vias having a reliability that is not achievable using prior art processes.
(2) It offers a forgiving process, i.e., insensitive to presence of oxide, organic contaminants, etc. on the M1 surface.
(3) It involves no new materials thereby reducing reliability exposure resulting from new and additional failure modes.
(4) It reduces material costs (chrome) and processing time. It also cuts the chemical costs in etching since there is no bottom chrome layer of M2 to be etched.
(5) It may also eventually eliminate the bright-dip operation which is at present a very time consuming operation.
(6) Copper is deposited onto a previously deposited copper film at high substrate temperature to form an interface without visible grain boundaries and utilized to make an electrical contact of low resistance.

While there have been shown and described and pointed out the fundamental features of the invention as applied to the preferred embodiment, it will be understood that various omissions and substitutions and changes may be made in the form and details of the embodiment by those skilled in the art without departing from the spirit of the invention. It is the intention, therefore, to be limited only as indicated by the scope of the following claims.

What is claimed is:

1. A process for making a multilayer integrated circuit substrate having via connections which comprises:
    depositing a first layer of chrome-copper-chrome onto an inorganic substrate;
    photoetching circuitry on said first layer;
    applying a layer of polyimide;
    photoetching via holes in the polyimide down to said circuitry;
    etching the top layer of chrome in said first layer to expose copper in said via holes;
    evaporating a second layer of copper-chrome at a high temperature of said substrate of 360°-380° C. to form a copper interface by the copper layer of said first layer and the copper layer of said second layer at the base of said via holes which has a low resistance; and
    photoetching circuitry on said second copper-chrome layer.

2. A process for making a multilayer integrated circuit substrate having via connections which comprises:
    depositing a first layer of chrome-copper-chrome onto a ceramic substrate;
    photoetching circuitry on said first layer;
    applying a layer of polyimide;
    photoetching via holes in the polyimide down to said circuitry;
    etching the top layer of chrome in said first layer to expose copper in said via holes;
    evaporating a second layer of copper-chrome at a temperature of said substrate of 360°-380° C. to form an interface of said copper layers at the base of said via holes which provides low via resistance; and
    photoetching circuitry on said second copper-chrome layer.

3. The process set forth in claim 2 wherein said via resistance is less than 1 milliohm.

4. A process for making a multilayer integrated circuit substrate having via connections which comprises:
    depositing a first layer of chrome-copper-chrome onto a ceramic substrate;
    photoetching circuitry on said first layer;
    applying a layer of polyimide;
    photoetching via holes in the polyimide down to said circuitry;
    "C" curing said polyimide at 360° C. in the presence of nitrogen;
    etching the top layer of chrome in said first layer to expose copper in said via holes;
    evaporating a second layer of copper-chrome onto said cured polyimide at a temperature of said substrate of 360°-380° C. to form an interface of said copper layers at the base of said via holes with said second copper layer adhering to said polyimide with a pull strength of 2000-4000 p.s.i.

* * * * *